(12) United States Patent
Ooishi

(10) Patent No.: US 6,833,225 B2
(45) Date of Patent: Dec. 21, 2004

(54) LITHOGRAPHIC PRINTING METHOD AND LITHOGRAPHIC PRINTING APPARATUS THEREOF

(75) Inventor: Hisao Ooishi, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 274 days.

(21) Appl. No.: 10/084,886

(22) Filed: Mar. 1, 2002

(65) Prior Publication Data

US 2002/0121206 A1 Sep. 5, 2002

(30) Foreign Application Priority Data

Mar. 1, 2001 (JP) ..................................... P.2001-057064

(51) Int. Cl.⁷ ............................ B41C 1/00; G03F 7/038; G03C 1/492; G03C 1/76
(52) U.S. Cl. ...................... 430/19; 101/450.1; 101/456; 101/465; 430/302; 430/273.1
(58) Field of Search ............................. 101/450.1, 456, 101/465; 430/302, 19

(56) References Cited

U.S. PATENT DOCUMENTS

| | | | | |
|---|---|---|---|---|
| 6,048,654 A | * | 4/2000 | Nakayama et al. ........... | 430/19 |
| 6,420,091 B1 | * | 7/2002 | Nakayama et al. .......... | 430/302 |
| 6,534,240 B1 | * | 3/2003 | Hoshi .......................... | 430/302 |
| 2002/0000169 A1 | * | 1/2002 | Suda et al. ............... | 101/463.1 |
| 2004/0129159 A1 | * | 7/2004 | Suda et al. .................. | 101/456 |

FOREIGN PATENT DOCUMENTS

| JP | 11-105234 A | 4/1999 |
|---|---|---|
| JP | 11-174664 | 7/1999 |

OTHER PUBLICATIONS

Machine Translated English version of JP 11–174664 from Japanese Patent Office Web site. No date. 22 pages.*

* cited by examiner

Primary Examiner—Cynthia Hamilton
(74) Attorney, Agent, or Firm—Sughrue Mion, PLLC

(57) ABSTRACT

A lithographic printing method forming a uniform layer of a hydrophobic substance on the entire surface of a printing plate precursor having a titanium dioxide-containing surface layer, by irradiating the surface of the precursor with active light to form imagewise hydrophilic areas to make a printing plate, said active light is far-ultraviolet light having a wavelength of 250 to 320 nm.

16 Claims, 5 Drawing Sheets

US 6,833,225 B2

LITHOGRAPHIC PRINTING METHOD AND LITHOGRAPHIC PRINTING APPARATUS THEREOF

BACKGROUND OF THE INVENTION

1. Field of the Invention

This invention generally relates to the art of lithographic printing. More specifically, it relates to a lithographic printing plate that can be made without involving developing processing, a method of making the printing plate, a lithographic printing method in which platemaking can be achieved on a printing press, and a printing apparatus enabling such platemaking.

2. Description of the Related Art

In the field of printing, emergence of a PS plate which is easy to make with rapidness has made lithographic printing supplant intaglio printing and letterpress printing. With the recent broadening of the printing market and the ever increasing demand for cost reduction, nevertheless, there has now been demands for development of new technologies which will bring more ease and rapidness in platemaking and reduction of industrial waste such as a waste developer.

To meet the market demands, various techniques have been proposed, in which a printing plate precursor having a photocatalyst compound and capable of changing its polarity between hydrophilicity and hydrophobicity on being irradiated with active light is used to make a printing plate of which the surface comprises hydrophilic areas and hydrophobic areas. These techniques are seen as extremely convenient because a printing plate precursor undergoes a polarity change simply upon being irradiated to form a printing plate having ink-receptive areas and ink-repellent areas according to whether irradiated or non-irradiated without. No developing processing is needed. Accordingly, the focus of the latest studies has been directed on how to achieve high print quality or to lengthen the press life of printing plates.

For example, JP-A-11-105234, JP-A-11-138970, JP-A-11-138971, JPA-11-143055, and JP-A-11-174664 disclose methods of platemaking and printing, in which a printing plate precursor having a photocatalytic metal compound thin film on its surface is imagewise exposed to active light to form a hydrophilicity/hydrophobicity distribution, and the printing plate after use can be reused by removing residual ink.

The printing method utilizing the character of a photocatalyst charging its polarity on irradiation for making an imagewise change in ink receptivity has a great merit of convenience. It has now been demanded to improve printing quality and press life in addition to this merit. To meet the demand, improvement on the contrast between irradiated areas and non-irradiated areas has been desired. The above-recited publications teach that photocatalyst titanium dioxide displays an appreciable change in polarity between hydrophilicity and hydrophobicity and is therefore highly effective for the contrast.

Digitization technology has been widespread in computer-aided processing, storing and outputting image information, and coupling the digitized image output with a platemaking process has been studied for rationalization of platemaking and printing processes. In particular, computer-to-plate (CTP) technology has been attracting attention, in which a plate precursor is directly scanned with light according to computer-processed image information to provide a printing plate without using a lith film. It is an important technical subject to develop a plate precursor, a printing method and a printing apparatus fit for CTP printing.

Use of photocatalytic titanium dioxide enables a CTP printing system using a rewritable printing plate precursor and will be a means meeting the market demand. In the practice, however, a photocatalytic film of titanium dioxide has low sensitivity and requires irradiation energy of several hundreds of millijoules to several joules per $cm^2$ for making a polarity change. That is, a printing plate precursor having a titanium dioxide film takes a lot of time for exposure, which ruins platemaking workability. A powerful ultraviolet laser having an output power of 10 W or higher might enable short time exposure but is too expensive to be applied to a direct printing press in the practice.

SUMMARY OF THE INVENTION

An object of the present invention is to provide a printing method in which a printing plate can be made conveniently with high sensitivity and presents excellent printing quality and a long press life and an apparatus for carrying out the method. Specifically, the object is to provide a printing method in which a printing plate can be prepared by direct imagewise exposure without involving developing processing, suffers from little background staining, and has a long press life.

Another object of the present invention is to provide a printing apparatus having the above-described platemaking system therein.

Still another object of the present invention is to provide a printing method and a printing apparatus which enable repeated use of a printing plate precursor.

In order to accomplish the above objects, it is required that a photocatalyst titanium dioxide film be capable of forming an image in a practically short exposure time. The present inventors have conducted extensive researches into a means for increasing the polarity conversion efficiency of titanium dioxide, paying their attention particularly to the spectral sensitivity of titanium dioxide. As a result, they have found that the objects are achieved by:

A lithographic printing method comprising forming a uniform layer of a hydrophobic substance on the entire surface of a printing plate precursor having a titanium oxide-containing surface layer, imagewise irradiating the surface of the precursor with active light to form hydrophilic areas to make a printing plate, wherein the active light is far-ultraviolet light having a wavelength of 250 to 320 nm.

The lithographic printing method of the invention includes the following preferred embodiments:

The far-ultraviolet light is emitted from a solid state laser having an oscillation wavelength of 256 nm or a low-pressure mercury lamp having a vapor pressure of 0.1 kPa or lower.

The layer of the hydrophobic substance is formed to such a thickness as to have a contact angle with a water drop of 70 to 120°.

The printing plate precursor comprises a grained aluminum support having provided thereon the titanium oxide-containing surface layer.

The hydrophobic substance is a subliming solid or a volatile liquid, and the layer of the hydrophobic substance is formed by condensing vapor of the hydrophobic substance on the titanium oxide-containing surface layer.

The hydrophobic substance is an organic polymer, and the layer of the hydrophobic substance is formed by spraying a solution or dispersion of the hydrophobic substance onto the titanium oxide-containing surface layer.

The layer of the hydrophobic substance is formed on the titanium oxide-containing surface layer by spread coating, spray coating, vapor condensation, gas contact or dip coating.

The printing plate after use is cleaned to remove residual ink and reused as a printing plate precursor.

The objects of the present invention is also accomplished by:

A lithographic printing apparatus having (1) a part in which a printing plate precursor having a titanium oxide-containing surface layer is fixed, (2) a part in which a layer of a hydrophobic substance is formed on the entire surface of the printing plate precursor, (3) a part in which the printing plate precursor with the hydrophobic layer is imagewise irradiated with far-ultraviolet light having a wavelength of 250 to 320 nm to form a printing plate having an imagewise hydrophilic areas/hydrophobic areas distribution, (4) a part in which ink is fed to the hydrophobic areas, and a fountain solution is fed to the hydrophilic areas, and (5) a part in which the printing plate having ink on the hydrophobic areas thereof and the fountain solution on the hydrophilic areas thereof is brought into contact with a printing substrate to carry out printing.

The lithographic printing apparatus according to the invention includes the following preferred embodiments:

The parts (1) to (5) are disposed around a plate cylinder.

The apparatus further has (6) a part in which the printing plate after use is cleansed with an ink solvent to make it reusable as a printing plate precursor.

The concept of the present invention is essentially based on utilization of far-ultraviolet light to which titanium dioxide exhibits high photo-sensitivity in showing polarity conversion (hereinafter simply referred to as photo-sensitivity or sensitivity). This basic feature is explained with reference to FIG. 1 showing a spectral sensitivity characteristic curve of titanium dioxide, in which a requisite quantity of energy for polarity conversion is plotted against wavelength. As shown in FIG. 1, the sensitivity of titanium dioxide to wavelengths of 350 nm or shorter is several times as much as that to the light in the near-ultraviolet region. Therefore, utilization of light in the far-ultraviolet region in imagewise exposure will make it feasible to increase the sensitivity even higher than 100 mJ/cm$^2$. This brings appreciable reduction in exposure time, leading to accomplishment of the objects of the present invention. The inventors have found that the concept can be materialized by using a low-pressure mercury lamp or a solid state laser as a light source.

On the other hand, the sensitivity of a printing plate precursor having a photocatalyst film varies depending on the material and the thickness of a layer of a hydrophobic substance (hereinafter referred to as a hydrophobilizing film) provided on the photocatalyst film. Accordingly, the objects of the invention are not always achieved merely by specifying the irradiation wavelength. In general, the thinner the hydrophobilizing film, the higher the sensitivity. However, as the hydrophobilizing film is made thinner, the hydrophobilizing effect decreases, and so does the press life. To secure sufficient ink receptivity for making a distinguishable contrast on a hydrophilic background, the hydrophobilizing film should have a water contact angle of at least 60° and, for practicability, 70 to 120°. The hydrophobilizing film is required to have such a thickness that the above range of a water contact angle is maintained on non-irradiated areas after imagewise exposure to far-ultraviolet light. It is not until the material and thickness of the hydrophobilizing film are properly selected to satisfy this requirement that both the photo-sensitivity and the hydrophobicity of non-irradiated areas can be secured in the system using far-ultraviolet light for imagewise exposure. In other words, only a combination of the irradiation wavelength range of 300 nm or shorter and the selected thickness of the hydrophobilizing film makes it possible to obtain a sensitivity of 100 mJ/cm$^2$ or higher through the hydrophobilizing film and a distinct hydrophilicity/hydrophobicity contrast between irradiated areas and non-irradiated areas.

A low-pressure mercury lamp and a solid state laser used in the invention are inexpensive, small enough to be incorporated into a printing press, and capable of forming an image within a practical exposure time. Use of these light sources realizes a direct printing system capable of making a printing plate in situ and meeting the market demand for CTP printing.

The lithographic printing method of the invention comprises forming a layer of a hydrophobic substance on a plate precursor having a titanium dioxide-containing surface layer to hydrophobilize the overall surface of the precursor, imagewise exposing the precursor with active light in the far-ultraviolet region to selectively form hydrophilic areas. There is thus obtained a printing plate having a distribution of irradiated areas (the areas having lost the hydrophobicity) and non-irradiated areas which retain hydrophobicity. According to the printing system of the invention constituted of the printing method, the printing plate precursor, and the printing apparatus capable of platemaking, the platemaking step is simple and convenient, no developing processing is involved, image formation is achieved in a short time, and practical printing quality and contrast are secured.

DESCRIPTION OF THE PREFERRED EMBODIMENTS

Figure 1:
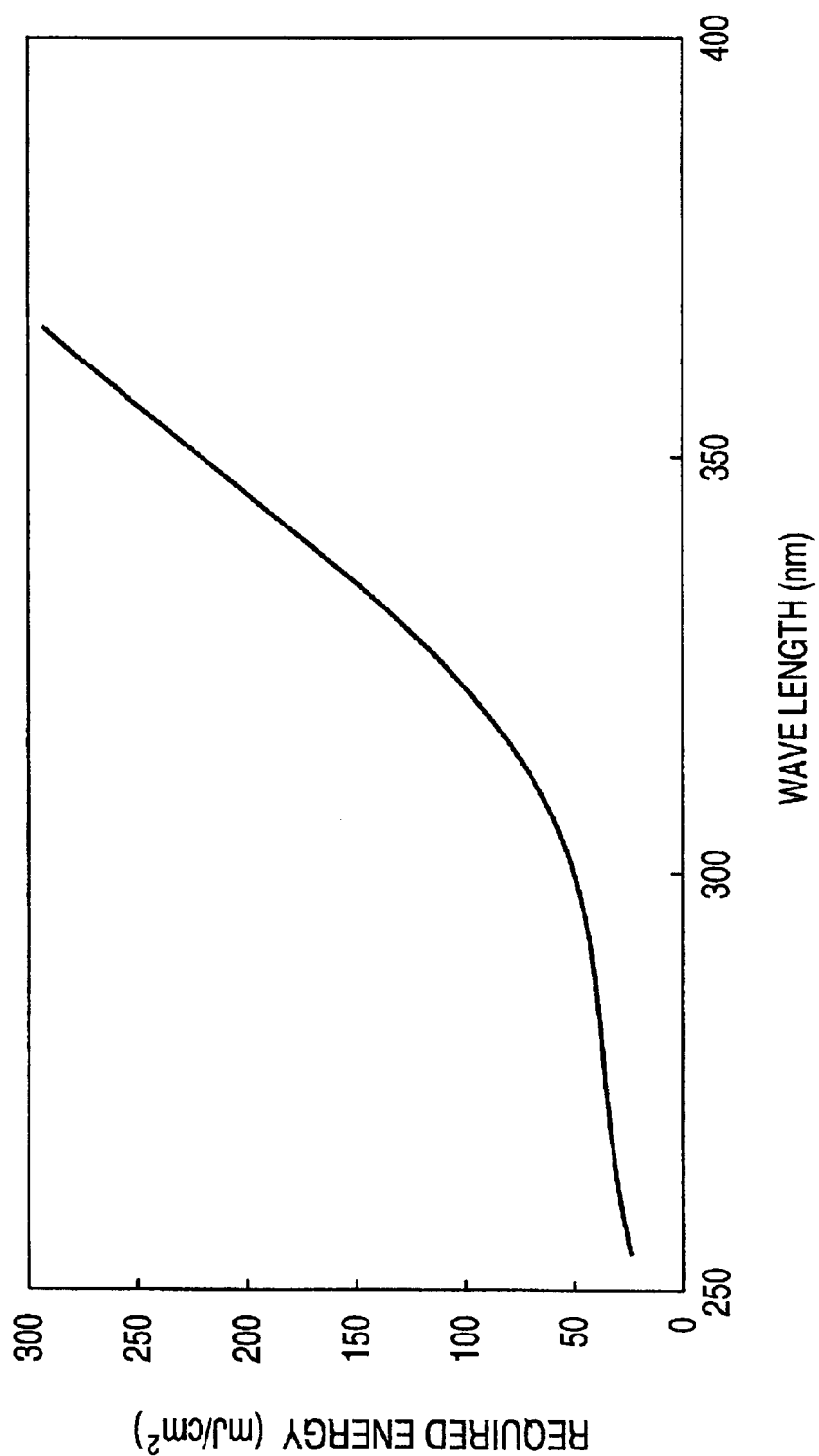
FIG. 1 is a spectral sensitivity characteristic curve of a titanium dioxide thin film.

The present invention will be described in detail in order of [I] printing plate precursor, i.e., a titanium dioxide-containing surface layer and a support therefor, [II] platemaking, i.e., materials of the hydrophobilizing layer, formation of the hydrophobilizing layer, imagewise exposure of the hydrophobilized precursor, the step of printing, and the step of regenerating the printing plate after use, and [III] printing apparatus.

I. Printing Plate Precursor

I-1. Titanium Dioxide-Containing Layer:

The printing plate precursor has a titanium dioxide-containing layer on its surface. The titanium dioxide-containing layer includes a continuous thin film of titanium dioxide, a thin film of fire-bonded titanium dioxide particles, and a film comprising a binder having titanium dioxide particles dispersed therein. A thin film made of a continuous phase of titanium dioxide is preferred for its high photocatalysis. The titanium dioxide-containing layer will hereinafter be referred to as a titanium dioxide thin layer or film. The titanium dioxide thin layer exhibits noticeable photocatalysis, which is made use of in the invention. The term "compound having photocatalysis", i.e., "photocatalytic compound" as used herein means a compound catalyzing a polarity change between hydrophilicity and hydrophobicity. The compound accelerates polarity conversion from hydrophobicity to hydrophilicity on being irradiated with active light.

Titanium dioxide which can be used in the invention is obtained by any known process, such as a sulfuric acid process and a chlorine process using ilumenite or titanium slag. The titanium dioxide thin film can also be formed by vacuum deposition using metallic titanium in the stage of platemaking as hereinafter described.

The titanium dioxide thin layer as a surface layer of a printing plate precursor can be formed by any known method, such as (1) a method comprising applying a dispersion of titanium dioxide crystallites, which can, if necessary, contain a small amount of a dispersing medium, i.e., a binder, to a support, (2) a method comprising baking the applied layer to reduce or remove the binder, (3) a method comprising depositing a titanium dioxide layer on a support by vacuum deposition, sputtering, ion plating, CVD, etc., or (4) a method comprising applying an organotitanium compound such as titanium butoxide to a support and baking the compound to oxidize. A titanium dioxide layer formed by vacuum deposition or sputtering is particularly preferred.

The methods (1) and (2) specifically include (i) a method comprising applying a dispersion of amorphous titanium dioxide crystallites followed by firing to form an anatase or rutile titanium dioxide layer, (ii) a method comprising applying a mixed dispersion of titanium dioxide and silicon oxide to form a surface layer, (iii) a method comprising applying a mixture of titanium dioxide and organosiloxane, etc. to form a titanium dioxide layer bonded to the support via a siloxane bond, (iv) a method comprising applying a dispersion of titanium dioxide in a polymer binder miscible with the oxide, and (v) a method comprising firing the coating layer to remove any organic matter. The binder to be used should have dispersing properties for titanium dioxide fine particles. Where the coating layer is fired, the binder should be removable by firing at relatively low temperature. Hydrophobic binders are preferably used. Suitable hydrophobic binders include polyalkylene resins, such as polyethylene, polybutadiene, polyacrylic esters, polymethacrylic esters, polyvinyl chloride, polyvinyl formate, polyethylene terephthalate, polyethylene naphthalate, polyvinyl alcohol, partially saponified polyvinyl alcohol, and polystyrene; and mixtures thereof.

Vacuum deposition of titanium dioxide (method (3)) is usually carried out by evaporating metallic titanium set on a heat source in a vacuum chamber having a degree of vacuum of $10^{-3}$ to $10^{-6}$ Pa under a total gas pressure of 1 to $10^{-3}$ Pa having an oxygen partial pressure of 30 to 90%. Sputtering (method (3)) is usually effected by sputtering a metallic titanium target with an RF power of 200 W in an argon atmosphere having a gas pressure of $5 \times 10^{-1}$ Pa at an $Ar/O_2$ molar ratio of 60/40.

The deposit film of titanium dioxide layer preferably has a thickness of 1 to 10000 nm, particularly 1 to 1000 nm. To avoid distortion due to light interference, a thickness of 300 nm or smaller is especially preferred. To draw photoactivation effect to the full, a thickness of 5 nm or greater is advantageous.

While any crystal form of titanium dioxide is usable, anatase crystals are preferred for sensitivity. It is well known that anatase crystals are obtained by selecting firing conditions. Anatase crystals may contain amorphous titanium dioxide or rutile titanium dioxide, but the anatase crystal content is preferably 40% or more, particularly 60% or more, based on the total titanium dioxide for the above reason.

Where the titanium dioxide thin layer contains a binder, etc., the main component of the layer should be titanium dioxide. The volume ratio of titanium dioxide in the layer is 30 to 100%, preferably 50% to 100%. A continuous phase containing no binder, i.e., a layer practically comprising 100% by volume of the oxide is the most preferred. However, because the purity is not so influential on the character of changing the surface hydrophilic/lipophilic properties as on the photoelectric effect for use as an electrophotographic photosensitive layer, a purity close to 100% (e.g., 98%) would be enough. This will be understood from the fact that the purpose is to obtain the character of the surface's changing between hydrophilic properties and lipophilic properties, which is a discrete character independent on electrical conductivity.

There are cases in which doping with a certain kind of metal is effective to enhance the property of thermally changing the surface hydrophilicity which is important for regenerating a printing plate as hereinafter described. Dopant metals having a small ionizing tendency meet this purpose. Preferred dopant metals include Pt, Pd, Au, Au, Ag, Cu, Ni, Fe, Co, Cr, and a combination of two or more thereof The amount of the dopant metal(s), if used, is not more than 5 mol % based on titanium of titanium dioxide.

If the volume ratio of titanium dioxide in the surface layer is too low, the heat-responsive sensitivity in hydrophilicity/hydrophobicity change is reduced. From this viewpoint, the volume ratio of titanium dioxide in the layer is desirably 30% or more, more desirably substantially 100%.

I-2. Support

The support of the printing plate precursor will be described covering an embodiment in which a precursor is processed as attached on a plate cylinder.

The printing plate precursor can have various forms and be made from various materials. For example, a thin layer of a hydrophilic/lipophilic material is formed directly on a plate cylinder of a printing press by vacuum deposition, dipping or spread coating, or a thin layer of a hydrophilic/lipophilic material with or without a support is fixed around a plate cylinder. In these cases, a printing plate is produced from the precursor as fixed on the plate cylinder. Otherwise, a printing plate precursor is separately processed into a printing plate, which is mounted on a rotary press or a flatbed press as is customary in the field of printing.

The support on which a layer of a hydrophilic/lipophilic material is formed should be thermally resistant and dimensionally stable. Metal plates made of, e.g., aluminum, SUS steel, nickel or copper, are preferred. Flexible metal plates are particularly preferred. Flexible plastic supports made of polyesters, cellulose esters, etc. are also useful. Waterproof paper, polyethylene-laminated paper or impregnated paper is also usable.

Specific examples of supports are paper, plastic-laminated paper (e.g., paper laminated with a polyethylene terephthalate sheet or a polyimide sheet), a metal plate (e.g., of aluminum, zinc, copper or stainless steel), a plastic film (e.g., of cellulose diacetate, cellulose triacetate, cellulose propionate, cellulose butyrate, cellulose acetate butyrate, cellulose nitrate, polyethylene terephthalate, polyimide, polystyrene, polycarbonate or polyvinyl acetal), and paper or a plastic film laminated with or deposited with the above-recited metal.

Preferred of them are a polyester film, a polyimide film, an aluminum plate or a SUS plate which hardly corrodes on a printing press. In particular, an aluminum plate which is dimensionally stable and relatively cheap and a polyimide film which is stable against thermal history in platemaking are preferred.

A preferred polyimide film is one prepared by polymerizing pyromellitic anhydride and m-phenylenediamine followed by cyclization into a polyimide. This film is commercially available, e.g., under a trade mark Kapton from Du Pont Toray Co., Ltd.

A preferred aluminum plate includes a pure aluminum plate and a plate of an aluminum-based alloy containing a trace amount of hetero elements. An aluminum-laminated or deposited plastic film is also preferred. The hetero elements in the aluminum alloy include silicon, iron, manganese, copper, magnesium, chromium, zinc, bismuth, nickel, and titanium. The total amount of these hetero elements is not more than 10% by weight. While a pure aluminum plate is the most suitable, existence of a trace amount of hetero elements is acceptable because of technical difficulty in refining to obtain 100% pure aluminum. Thus, the aluminum plate to be used in the present invention is not particularly limited by composition, and aluminum plates made of conventional known materials can be utilized appropriately. The metallic support for use in the invention usually has a thickness of about 0.1 to 0.6 mm, preferably 0.15 to 0.4 mm, still preferably 0.2 to 0.3 mm. Other supports made of plastics, processed paper, etc. for use in the invention usually has a thickness of about 0.1 to 2.0 mm, preferably 0.2 to 1.0 mm.

It is preferred for an aluminum plate to have its surface grained. If necessary, an aluminum plate is degreased (removal of rolling oil) with a surface active agent, an organic solvent, an aqueous alkali solution, etc. prior to graining. Graining of an aluminum plate can be conducted in various known methods, such as mechanical graining, electrochemical surface dissolution, or selective chemical surface dissolution. Mechanical graining is conducted in a known manner, for example, by ball polishing, brush polishing, blasting or buffing. Electrochemical graining can be carried out in a hydrochloric acid or nitric acid electrolytic solution with an alternating or direct current applied. According to necessity, the grained aluminum plate is subjected to alkali etching and neutralization. If desired, the grained aluminum plate is anodized to increase water receptivity or wear resistance. The electrolyte concentration in anodizing is decided according to the kind of the electrolyte.

Variable according to the kind of the electrolyte, anodizing conditions are not generally specified. Anodizing is usually carried out at an electrolyte concentration of 1 to 80% by weight, a liquid temperature of 5 to 70° C., a current density of 5 to 60 A/dm$^2$, a voltage of 1 to 100 V, and for an electrolysis time of 10 seconds to 5 minutes. The anodized layer preferably has a thickness (depth) corresponding to 1.0 g/m$^2$ or more. A smaller thickness tends to result in insufficient press life or allows non-image areas of the printing plate to receive scratches easily. Scratches on the non-image areas receive ink on printing to cause staining.

II. Platemaking

II-1. Hydrophobilization

The above-described printing plate precursor is hydrophobilized all over the surface. Many photocatalytic metal oxides are made hydrophobic on being heated at a high temperature, e.g., about 80 to 140° C. as disclosed in JPA-11-174665, JP-A-11-138970, and JP-A-11-143055. Although the titanium dioxide layer of the precursor could be hydrophobilized by this heating method, the present invention adopts formation of a hydrophobilizing layer on the entire surface of the precursor for securing more positive and more reliable hydrophobicity to bring further improved contrast between image areas and non-image areas. The substance to be used to form the hydrophobilizing layer will hereinafter be called a hydrophobilizer.

The terminology "hydrophobicity" as used herein is used to describe the property of a surface which makes a contact angle with a water drop greater than that on a so-called hydrophilic or lipophilic material. Specifically, the terminology is intended to describe the property of making a water contact angle of 60° or greater, preferably 70° or greater.

The hydrophobilizer is selected from a wide range of substances that are capable of forming a film with the above-identified hydrophobicity. Compounds meeting the requirements as a hydrophobilizer are found in (1) organic low-molecular compounds, (2) organic silicone compounds, and (3) organic high-molecular compounds (polymers), which are described below in detail.

(1) Organic Low-Molecular Compounds

Organic low-molecular compounds which can be used as a hydrophobilizer include (i) those having a solubility of not more than 2 g in 100 g of water at 25° C. and (ii) those having an organicity/inorganicity ratio of 0.7 or greater in the organic conception diagram. Use of both a compound of the group (i) and a compound of the group (ii) is a preferred embodiment. The term "low-molecular compound" as referred to herein is used to mean a compound having a boiling point or a melting point. Such a compound generally has a molecular weight less than 2000, mostly less than 1000. While a water solubility of 2 g/100 g or less at 25° C. is one of the requirements for use as a printing plate, it is also known from experience to be a requirement for hydrophobicity.

The organic conception diagram is a practical and convenient means for indicating the degree of organicity and inorganicity of a compound. For the details, refer to Kohda Yoshio, *Yuki Gainenzu*, pp. 1–31, Sankyo Shuppan (1983). Although the reason why an organic compound belonging to the group (ii) based on the organic conception diagram principle has an action of accelerating hydrophobilization is unknown, compounds of the group (ii) have relatively high organicity and serve to hydrophobilize the vicinities of complex particles. The organic value of these compounds is 100 or greater in the organic conception diagram. The upper limit of the organic value is not particularly limited but is usually 100 to 1200, preferably 100 to 800. The organicity/inorganicity ratio of the compounds is from 0.7 to infinity (i.e., the inorganicity is zero), preferably 0.9 to 10.

The organic low-molecular compounds belonging to the groups (i) and (ii) are found in aliphatic or aromatic hydrocarbons, aliphatic or aromatic carbocylic acids, aliphatic or aromatic alcohols, aliphatic or aromatic esters, aliphatic or aromatic ethers, organic amines, organosilicon compounds, and various solvents and plasticizers known applicable to printing ink.

The aliphatic hydrocarbons preferably include those having 8 to 30, particularly 8 to 20, carbon atoms. The aromatic hydrocarbons preferably include those having 6 to 40, particularly 6 to 20, carbon atoms. The aliphatic alcohols preferably include those having 4 to 30, particularly 6 to 18, carbon atoms. The aromatic alcohols preferably include those having 6 to 30, particularly 6 to 18, carbon atoms. The aliphatic carboxylic acids preferably include those having 4 to 24 carbon atoms, particularly aliphatic monocarboxylic acids having 6 to 20 carbon atoms and aliphatic polycarboxylic acids having 4 to 12 carbon atoms. The aromatic carboxylic acids preferably include those having 6 to 30, particularly 6 to 18, carbon atoms. The aliphatic esters preferably include those having 2 to 30, particularly 2 to 18, carbon atoms. The aromatic esters preferably include aromatic carboxylic acid esters having 8 to 30, particularly 8 to 18, carbon atoms. The aliphatic ethers preferably include those having 8 to 36, particularly 8 to 18, carbon atoms. The aromatic ethers preferably include those having 7 to 30, particularly 7 to 18, carbon atoms. Additionally aliphatic or aromatic amides having 7 to 30, preferably 7 to 18, carbon atoms are also useful.

Specific examples of the low-molecular organic compounds are aliphatic hydrocarbons, such as 2,2,4-trimethylpentane (iso-octane), n-nonane, n-decane, n-hexadecane, octadecane, eicosane, methylheptane, 2,2-dimethylhexane, and 2-methyloctane; aromatic hydrocarbons, such as benzene, toluene, xylene, cumene, naphthalene, anthracene, and styrene; monohydric alcohols, such as dodecyl alcohol, octyl alcohol, n-octadecyl alcohol, 2-octanol, and lauryl alcohol; polyhydric alcohols, such as hexylene glycol and dipropylene glycol; aromatic alcohols, such as benzyl alcohol, 4-hydroxytoluene, phenethyl alcohol, 1-naphthol, 2-naphthol, catechol, and phenol; aliphatic monocarboxylic acids, such as butyric acid, caproic acid, acrylic acid, crotonic acid, capric acid, stearic acid, and oleic acid; aromatic carboxylic acids, such as benzoic acid, 2-methylbenzoic acid, and 4-methylbenzoic acid; aliphatic esters, such as ethyl acetate, isobutyl acetate, n-butyl acetate, methyl propionate, ethyl propionate, methyl butyrate, methyl acrylate, dimethyl oxalate, dimethyl succinate, and methyl crotonate; aromatic carboxylic acid esters, such as methyl benzoate and methyl 2-methylbenzoate; organic amines, such as imidazole, 2,2-dimethylimidazole, 4-methylimidazole, indazole, benzimidazole, cyclohexylamine, hexamethylenetetramine, triethylenetetramine, octylamine, and phenethylamine; ketones, such as methyl ethyl ketone, methyl isobutyl ketone, and benzophenone; ethers, such as methoxybenzene, ethoxybenzene, methoxytoluene, lauryl methyl ether, and stearyl methyl ether; and amides, such as stearylamide, benzoylamide, and acetamide.

In addition, organic solvents whose boiling point is within the above-recited range, such as ethylene glycol monoethyl ether, cyclohexanone, butyl cellosolve, and cellosolve acetate; fats and oils used in printing ink, such as linseed oil, soybean oil, poppy seed oil, and safflower oil; and plasticizers also used in printing ink, such as tributyl phosphate, tricresyl phosphate, dibutyl phthalate, butyl laurate, dioctyl phthalate, and paraffin wax, are also usable.

Esters of long-chain fatty acids and long-chain monohydric alcohols, i.e., waxes are also preferred low-molecular organic compounds. They are hydrophobic, have moderately low melting points, and, when disposed near fine particles capable of photothermal conversion, melt by heat generated by irradiation of the particles to hydrophobilize that region. Waxes which melt at 50 to 200° C. are preferred. Examples of useful waxes are carnauba wax, castor wax, microcrystalline wax, paraffin wax, shellac wax, palm wax, and beeswax. A fine dispersion of a solid acid, such as oleic acid, stearic acid or palmitic acid, or a long-chain fatty acid metal salt, such as silver behenate, calcium stearate or magnesium palmitate, also serves as a hydrophobilizer.

Of organic low-molecular compounds perfluoro compounds are advantageous for effective hydrophobilization. Examples of preferred perfluoro compounds include perfluoro aliphatic carboxylic acids, such as perfluoroacetic acid, perfluorobutyric acid, perfluorovaleric acid, perfluorocapric acid, perfluoroheptanoic acid, perfluorocaproic acid, and perfluorocaprylic acid; perfluoro hydrocarbons, such as perfluorohexane, perfluorooctane, perfluorotripropylamine, perfluorotributylamine, perfluorohexyl ether, and perfluorododecane; and perfluoro aliphatic alcohols, such as perfluorobutanol, perfluoropentanol, perfluorohexanol, perfluorooctanol, and perfluorodedecyl alcohol.

(2) Organosilicon Compounds

Preferred organosilicon compounds are effective hydrophobilizers that hydrophobilize the surface of a hydrophilic/lipophilic material-containing layer of a printing plate precursor. Organosilicon compounds used for this purpose include (2-a) organopolysiloxanes, (2-b) organosilanes, and (2-c) fluorine-containing organosilicon compounds.

(2-a) Organopolysiloxanes

Organopolysiloxanes are represented by dimethyl silicone oil and methylphenyl silicone oil. Organopolysiloxanes having a degree of polymerization of 12 or smaller are particularly preferred. The preferred organopolysiloxanes carry one or two organic groups per siloxane bond. The organic groups include an alkyl or alkoxy group having 1 to 18 carbon atoms, an alkenyl or alkynyl group having 2 to 18 carbon atoms, an aryl group having 6 to 18 carbon atoms, an aralkyl group having 7 to 18 carbon atoms, and an alicyclic group having 5 to 20 carbon atoms. These organic groups may be substituted with a halogen atom, a carboxyl group or a hydroxyl group. Of the organic groups the aryl, aralkyl or alicyclic group may be substituted with a lower alkyl group, such as methyl, ethyl or propyl, provided that the total carbon atom number is within the above-recited respective ranges.

Examples of the preferred organopolysiloxanes include, but are not limited to, those comprising, as a repeating unit, at least one of (i) a dialkylsiloxane group having 1 to 5 carbon atoms in the alkyl moiety thereof, (ii) a dialkoxysiloxane group having 1 to 5 carbon atoms in the alkoxy moiety thereof, (3) an alkoxyphenylsiloxane group having an alkoxy group containing 1 to 5 carbon atoms and a phenyl group, and (4) an ethoxymethoxysiloxane group, or a methoxyethoxysiloxane group and having a degree of polymerization of 2 to 12, particularly 2 to 10, the end group of which is selected from an alkyl group having 1 to 5 carbon atoms, an amino group, a hydroxyl group, a hydroxyalkyl group having 1 to 5 carbon atoms, and an alkoxy group having 1 to 5 carbon atoms, particularly from a methyl group, an ethyl group, an isopropyl group, an n-propyl group, an n-butyl group, a t-butyl group, a methoxy group, and an ethoxy group.

Particularly preferred organopolysiloxanes include dimethyl polysiloxane having a degree of polymerization of 2 to 10, a dimethylsiloxane/methylphenylsiloxane copolymer having a degree of polymerization of 2 to 10, a dimethylsiloxane/diphenylsiloxane copolymer having a degree of polymerization of 2 to 8, and a diemthylsiloxane/monomethylsiloxane copolymer having a degree of polymerization of 2 to 8, the end group of these compounds being a trimethylsilane group. Additional preferred organopolysiloxanes include 1,3-bis(3-aminopropyl)

tetramethyldisiloxane, 1,5-bis(3-aminopropyl) hexamethyltrisiloxane, 1,3-dibutyl-1,1,3,3-tetramethyldisiloxane, 1,5-dibutyl-1,1,3,3,5,5-hexaethyltrisiloxane, 1,1,3,3,5,5-hexaethyl-1,5-dichloro-trisiloxane, 3-(3,3,3-trifluoropropyl)-1,1,3,3,5,5,5-heptamethyltrisiloxane, and decamethyltetrasiloxane.

Silicon oils are especially preferred as general-purpose compounds, which include dimethyl silicone oil (commercially available as Silicone KF96 from Shin-Etsu Chemical Co., Ltd.), methylphenyl silicone oil (commercially available as Silicone KF50 from Shin-Etsu Chemical), and methylhydrogen silicone oil (commercially available as Silicon KF99 from Shin-Etsu Chemical).

(2-b) Organosilanes

Organosilane compounds useful as a hydrophobilizer include n-decyltrimethoxysilane, n-decyltri(t-butoxy)silane, n-octadecyltrimethoxy-silane, n-octadecyltriethoxysilane, and dimethoxydiethoxysilane.

(2-c) Fluorine-Containing Organosilicon Compounds

Silanes, silanols and siloxanes having a fluorine-containing group as a substituent also serve as a hydrophobilizer. Preferred fluorine-containing organosilicon compounds are silanes, silanols and siloxanes having a polyfluoroalkyl group (e.g., 3,3,3-trifluoropropyl, trifluoromethyl, trifluorobutyl, trifluoroethyl, trifluoropentyl or 3,3,4,4,5,5,6,6,6-nonafluoro-hexyl), a trifluoroacyloxy group (e.g., trifluoroacetoxy or 2,2,2-trifluoroethoxy), a trifluoroacyl group e.g., trifluoroacetyl) or a trifluoroalkylsulfone group (e.g., trifluoromethanesulfone or 3,3,3-trifluoropropylsulfone).

Examples of preferred compounds are methyl-3,3,3-trifluoropropyldichlorosilane, 3,3,4,4,5,5,6,6,6-nonafluorohexyltrichlorosilane, 3,3,3-trifluoropropylsilane-trimethoxysilane, 3,3,4,4,5,5,6,6,6-nonafluorohexyl-methyldichlorosilane, 1,3,5-tris(3,3,3-trifluoropropyl)-1,3,5-trimethylcyclotrisiloxane, methyl-3,3,3-trifluoropropylsilanediol, 3,3,4,4,5,5,6,6,6-nonafluorohexylsilanetriol, 3,3,4,4,5,5,6,6,6-nonafluorohexylmethylsilanediol, pentafluoroethoxysilanetriol, trifluoromethylsilanetriol, and 3,3,3-trifluoropropylmethoxysilanetriol.

These organosilicon compounds are commercially available from, e.g., Shin-Etsu Chemical Co., Ltd. Commercially purchased organochloro-silanes are hydrolyzed to give corresponding organosilanols, which are condensed to give corresponding organosiloxanes.

(3) Organic Polymers

Organic polymers which can be used as a hydrophobilizer are hydrophobic polymers that are soluble in co-existing low-molecular organic compounds, dispersible in water or organic solvents, or thermoplastic per se. Such organic polymers include polyethylene, polypropylene, polyester, polyvinyl chloride, polyvinyl acetate, polyvinyl phenol, polyvinyl halogenophenol, polyvinyl formal, polyvinyl acetal, polyvinyl butyral, polyamide, polyurethane, polyurea, polyimide, polycarbonate, epoxy resins, condensation polymers prepared from a phenol, a novolak or a resol and an aldehyde or a ketone, polyvinylidene chloride, polystyrene, and acrylic copolymer resins.

A group of preferred polymers are phenol novolak resins or resol resins, which are not always thermoplastic, including those obtained by condensation between formaldehyde and a phenolic compound, such as phenol, cresol (e.g., m-cresol, p-cresol or m/p-mixed cresol), phenol/cresol (e.g., m-cresol, p-cresol or m/p-mixed cresol), phenol-modified xylene, t-butylphenol, octylphenol, resorcinol, pyrogallol, catechol, chlorophenol (e.g., m-chlorophenol or p-chlorophenol), bromophenol (e.g., m-bromophenol or p-bromophenol), salicylic acid or phloroglucinol; and condensation polymers prepared from the above -enumerated phenolic compound and acetone.

Another group of preferred polymers include polyethylene, polypropylene, polyester, polyamide, acrylic resins, vinyl chloride resins, vinylidene chloride resins, polyvinyl butyral resins, nitrocellulose, polyacrylate, polymethacrylate, polycarbonate, polyurethane, polystyrene, vinyl chloride/vinyl acetate copolymers, vinyl chloride/vinyl acetate/vinyl alcohol copolymers, vinyl chloride/vinyl ?????/maleic acid copolymers, vinyl chloride/acrylate copolymers, polyvinylidene chloride, and vinylidene chloride/acrylonitrile copolymers.

Hydrophobic resins in the form of an aqueous emulsion are also useful. The aqueous emulsion is a suspension of fine polymer particles dispersed in water, if desired, in the presence of protective colloid. Such aqueous emulsions include vinyl polymer latices (e.g., polyacrylate emulsion, polyvinyl acetate emulsion, and ethylene-vinyl acetate copolymer emulsion), conjugated diene polymer latices (e.g. methyl methacrylate/butadiene rubber latex, styrene-butadiene rubber latex, acrylonitrile-butadiene rubber latex, and chloroprene rubber latex) and polyurethane resins.

These organic polymers preferably have a weight average molecular weight of 500 to 20,000 and a number average molecular weight of 200 to 60,000.

The above-described organic low-molecular compounds, organosilicon compounds and organic polymers can be used as a hydrophobilizer either individually or as a combination of two or more thereof. In the latter case, a third component which increases affinity between the two or more kinds of the hydrophobilizers can be used in combination.

If necessary, the hydrophobilizer is formulated into a solution or a dispersion in an organic solvent, such as ethylene glycol monomethyl ether, cyclohexanone, methyl cellosolve, butyl cellosolve, cellosolve acetate, 1,4-dioxane, dimethylformamide or acrylonitrile.

A hydrophobilizing layer is formed on the layer containing a hydrophilic/lipophilic material by any known techniques, such as spread coating, spray coating, vapor condensation, gas contact or dip coating.

The hydrophobilizing layer is preferably formed to such a thickness as to have a contact angle with a water drop of 70 to 120° so that imagewise exposure may result in high contrast between exposed areas showing hydrophilicity and non-exposed areas remaining hydrophobic. Varying depending on the kind of the hydrophobilizer, the thickness should be adjusted accordingly to have a water contact angle falling within this range. A suitable thickness is usually in a range of from 10 to 100 ml/m$^2$, preferably of from 15 to 50 ml/m$^2$.

a) Spread Coating

Spread coating is a method applicable to either a liquid or a solid hydrophobilizer. A liquid hydrophobilizer can be applied directly. A solid hydrophobilizer or even a liquid hydrophobilizer is applied as dissolved or dispersed in an appropriate medium. Spread coating includes gravure coating, reverse coating, hopper coating, and slit coating such as known for a coating development method. In another embodiment of spread coating, a spread coating layer of a hydrophobilizer can be formed on a printing plate precursor by a sheet treatment using a medium carrying the hydrophobilizer, which is described, e.g., in Japanese Patent 2655337. Media which can be used in this sheet treatment include felt, woven fabric, and slitted or perforated metal plates;. Of the spread coating techniques, the method disclosed in JP-A-8-290088, JP-A-8-290087, and JP-A-9-

138493 which comprises spreading a liquid with sponge, etc. is preferred.

b) Spray Coating

A liquid hydrophobilizer or a hydrophobilizer dispersion or solution is sprayed onto a printing plate precursor to form a hydrophobilizing layer. In an embodiment, a hydrophobilizing liquid is sprayed in excess, and the running excess of the liquid is collected and reused. The spraying method or system and the number or shape of nozzles are not limited. Either a single moving nozzle or a plurality of stationary nozzles can be used. In particular, the apparatus for applying a solvent for image formation disclosed in JP-A-8-123001, JP-A-9-160208, and JP-A-9-179272 is preferably applied to the present invention. The apparatus comprises a nozzle head having a plurality of nozzles, through which a coating liquid (the hydrophobilizer or the hydrophobilizer dispersion or solution) is spouted, linearly aligned at a given interval in the direction perpendicular to the running direction of a substrate (a printing plate precursor) and an actuator which displaces the nozzle head toward the substrate.

c) Vapor Contact Method

Vapor contact method is a technique comprising vaporizing a subliming solid hydrophobilizer, a volatile liquid hydrophobilizer or a volatile hydrophobilizer solution by heating, bringing the vapor into contact with a printing plate precursor, whereby the vapor is condensed to form a film of the hydrophobilizer.

Organic compounds that are effectively fit for this method are those which have a vapor pressure of at least 100 Pa at 400° C. and are stable at a temperature at which the vapor pressure reaches 100 Pa. Existence of an organic compound having such a vapor pressure in a heating atmosphere results in improvement on hydrophilicity/hydrophobicity contrast. More effective organic compounds are those which have a vapor pressure of at least 100 Pa at 300° C. and are stable at a temperature at which the vapor pressure reaches 100 Pa. The most effective organic compounds are those having a boiling point of 30 to 400° C., particularly 30 to 350° C., and are stable at temperatures ranging from 30 to 400° C.

The hydrophobilizer is advantageously heated by setting a container filled with the hydrophobilizer in a heating element housing which is disposed close to the printing plate precursor so that vapor of the hydrophobilizer may be present in the housing during the heating time. It is also an advisable embodiment that paper, cloth, zeolite, diatomaceous earth, etc. impregnated with a hydrophobilizer liquid is placed in the housing.

d) Gas Contact

In using a gaseous hydrophobilizer, particularly the above-described fluorine-containing organic compound, a printing plate precursor can be placed in an atmosphere containing the gas to achieve high hydrophobilization.

e) Dip Coating

A hydrophobilizing layer can be formed by dipping a printing plate precursor in a dipping vat as is commonly employed in the field of coating.

II-2. Image Formation

The area irradiated with active light becomes hydrophilic by the photocatalysis to form a hydrophilic area. As previously stated, image formation for printing is effected by imagewise exposure to far-ultraviolet light. A preferred light source for far-ultraviolet light is a low-pressure mercury lamp and a solid state laser.

The spectral distribution of a mercury lamp varies with the vapor pressure of mercury sealed in a discharge tube. With the vapor pressure ranging 1 to 100 Pa, preferably 2 to 30 Pa, still preferably 5 to 20 Pa, there is no absorption loss of bright lines in the shorter wavelength region so that a bright line appears intensely at 253.7 nm to supply light of the wavelength to which titanium dioxide is highly sensitive. A high-pressure or an ultrahigh-pressure mercury lamp is not favorable because the bright line at 253.7 nm is absorbed by light energy of other wavelengths. A commercially available low-pressure mercury lamp can be made use of.

A solid state laser has different oscillation wavelengths depending on the material and the structure. A solid state laser having an oscillation wavelength of 266 nm is preferred for use in the present invention. Any commercially available solid state laser can be used. Imagewise exposure can be carried out at room temperature. Heating the photocatalyst layer during exposure increases the sensitivity. Irradiation intensity of far-ultraviolet light is from 10 to 100 $mJ/cm^2$, preferably 30 to 50 $mJ/cm^2$.

Since practical sensitivity for polarity conversion through the hydrophobilizing layer is dependent on the thickness of the hydrophobilizing layer and the properties of the hydrophobilizer, proper choices of these factors will bring about further improved sensitivity for polarity conversion.

Existence of a far-ultraviolet-absorbing material between a light source and the printing plate precursor should be avoided. Materials highly transparent to light having shorter wavelengths than 300 nm include quartz glass and resins containing no ultraviolet-absorbing plasticizer. Useful resins include polyolefins (e.g., polyethylene and polypropylene), acrylic resins (e.g., polymethyl methacrylate, polyethyl acrylate, and polypropylmethyl acrylate), polyvinyl acetate, polyvinyl alcohol or alkyl-modified polyvinyl alcohol, copolymer resins comprising these resin components, and mixtures of these resins. An image forming mask which can be used comprises a substrate made of these transparent materials having a masking image formed thereon by known methods capable of maintaining the non-image areas intact, such as a wash-off relief image, a diffusion transfer image, an image formed by ink jet printing, a dye transfer image, and the like. Where additional layers such as a protective layer, a primer layer and an image-receiving layer are provided, they must not contain far-ultraviolet-absorbing additives.

Where the support of the printing plate precursor is transparent, the precursor may be exposed from its support side through a mask.

Imagewise exposure can be performed either by planar exposure (exposure of the entire surface of the plate to light with uniform intensity) or scanning exposure. In using a low-pressure mercury lamp, planar exposure through a mask is suitable. In using a solid state laser, scanning with a laser beam modulated according to image signals is preferred.

II-3. Hydrophilicity Enhancement and Stabilization of Hydrophilic Area

The imagewise hydrophobilized area usually turns hydrophobic with time, and the hydrophilicity/hydrophobicity contrast tends to decrease with time accordingly, which can cause reduction in printing performance and press life. Hence, if necessary, the imagewise exposure is followed by hydrophilicity-enhancing treatment for keeping a high hydrophilicity hydrophobicity contrast. The hydrophilicity-enhancing treatment is carried out with a hydrophilicity-enhancing agent mainly comprising water.

Various additives, such as a wetting-improving agent and an assistant therefor, a water-soluble polymer, a pH adjustor, a wetting agent, a preservative, a colorant, and an antifoam agent, can be added to water. Suitable wetting-improving agents are selected from ethylene glycol, polyethylene glycol alkyl ethers containing 2 or 3 carbon atoms in the alkylene moiety, polyethylene glycol having molecular weight of 100 to 800, alkylsulfonic acids having 2 or 3 carbon atoms in the alkyl moiety thereof, aliphatic alcohols having 1 to 3 carbon atoms, and surface active agents. Hydrophilicity enhancing agents known for lithographic printing or their solutions can be used.

Suitable assistants for wetting-improving agents include anionic or nonionic surface active agents. Surface active agents can be used either individually or as a combination thereof The amount of the surface active agents to be added is not more than 1.0%, preferably 0.001 to 0.5%, by weight to avoid foaming.

Useful water-soluble polymers include naturally occurring polymers and their derivatives, such as gum arabic, starch derivatives (e.g., dextrin, enzymatically decomposed dextrin, hydroxypropylated enzymatically decomposed dextrin, carboxymethylated starch, phosphorated starch and octenylsuccinated starch), alginates, and cellulose derivatives (e.g., carboxymethyl cellulose, carboxyethyl cellulose and methyl cellulose); and synthetic resins, such as polyethylene glycol and its copolymers, polyvinyl alcohol and its derivatives, polyvinylpyrrolidone, and polyacrylamide and its copolymers. The water-soluble polymers are suitably used in an amount of 0.0001 to 0.1%, preferably 0.0005 to 0.05%, by weight based on the hydrophilicity-enhancing agent or a solution thereof.

Useful pH adjustors include water-soluble organic and/or inorganic acids and their salts. These compounds are effective for pH adjustment or buffering of the hydrophilicity-enhancing agent or a solution thereof and for moderate etching or anticorrosion of the support of the lithographic printing plate. Suitable organic acids include citric acid, ascorbic acid, malic acid, tartaric acid, lactic acid, acetic acid, gluconic acid, hydroxyacetic acid, oxalic acid, malonic acid, levulinic acid, sulfanilic acid, p-toluenesulfonic acid, phytic acid, and organic phosphonic acids. Suitable inorganic acids include formic acid, phosphoric acid, nitric acid, sulfuric acid, and polyphosphoric acid. Alkali metal salts, alkaline earth metal salts, ammonium salts and organic amine salts of these organic or inorganic acids are also suitable. The pH-adjustors are used in an amount such that the hydrophilicity-enhancing agent or a solution thereof is used in an acidic region of pH 3 to 7, which corresponds to 0.001 to 0.3% by weight based on the hydrophilicity-enhancing agent or a solution thereof.

Suitable wetting agents include ethylene glycol, diethylene glycol, triethylene glycol, propylene glycol, dipropylene glycol, tripropylene glycol, butylene glycol, hexylene glycol, glycerol, diglycerol, polyglycerol, and trimethylolpropane. These wetting agents can be used either individually or as a combination of two or more thereof. The wetting agents are usually added in an amount of 0.01 to 3% by weight.

Suitable preservatives include phenol and derivatives thereof, formalin, imidazole derivatives, sodium dehydhroacetate, 4-isothiazolin-3-one derivatives, and benzotriazole derivatives. Suitable colorants include food colors.

II-4. Printing and Regeneration of Precursor

The above-described processing on the precursor gives a finished printing plate that can be sent to a lithographic printing step without developing processing. Therefore, the present invention has many advantages represented by convenience over conventional lithographic printing techniques. That is, a chemical treatment with an alkaline developer is unnecessary. Operations associated with the chemical treatment, such as wiping and brushing, are not needed. The platemaking involves no environmental load due to discharge of a developer waste liquid. Above all, the platemaking is simple and easy.

If desired, the imagewise hydrophilized area of the printing plate can be post-treated with washing water, a rinsing solution containing a surface active agent, etc. or a desensitizing solution containing gum arabic or a starch derivative (these liquids are designated "burning conditioners"). These post-treatments can be combined appropriately. The post-treatment can be carried out by, for example, swabbing the printing plate with sponge or a cotton wad impregnated with the burning conditioner, dipping the plate in a vat filled with the burning conditioner, or applying the burning conditioner by means of an automatic coater. After application, leveling the surface with a squeegee or a squeegee roll gives better results. The burning conditioner is usually applied in an amount of 0.03 to 0.8 g/m$^2$ on a dry basis. The thus treated printing plate is mounted on an offset printing machine, etc., or the printing plate prepared from a precursor as mounted on a printing machine is used to produce a great number of prints.

After printing, the printing plate can be regenerated into a printing plate precursor through a ink removal step, i.e., a cleaning step in which the plate is cleared of any residual printing ink and an initialization step for erasing the hydrophobicity/hydrophilicity contrast. In the cleaning step, ink is washed off with a hydrophobic petroleum solvent. Useful solvents include aromatic hydrocarbons, such as kerosine and Isoper, which are commercially available as printing ink dissolvers. Additionally, benzole, toluol, xylol, acetone, methyl ethyl ketone, and mixtures thereof are also useful. In case ink hardly dissolves, it can be lightly wiped off with cloth. A 1/1 mixture of toluene/Dai-Clean (a printing ink cleaner available from Dainippon Ink & Chemicals, Inc.) is effective for some kinds of ink.

An additional treatment with a diluted acid, such as diluted sulfuric acid, diluted nitric acid or diluted hydrochloric acid, is employable to remove stains or other residues from the platemaking and printing history. The acid is usually used at a concentration of 0.001 to 0.1 mol/l, preferably 0.005 to 0.05 mol/l. Addition of 0.001 to 0.01 mol/l of hydrogen peroxide to the diluted acid is effective in some cases.

The ink-free printing plate is then subjected to initialization by active light irradiation for reuse as a printing plate precursor. A light source emitting light of wavelength corresponding to the sensitivity region, i.e., light absorption region, of photocatalyst titanium dioxide is used for initialization. Anatase titanium dioxide and rutile titanium dioxide exhibit photosensitivity in the ultraviolet region of 387 nm or shorter and 413 nm or shorter, respectively. A typical spectral distribution curve of titanium dioxide is as shown in FIG. 1. Accordingly, the light source to be used for initialization is one emitting light in these wavelength regions, that is, one mainly emitting ultraviolet rays. Upon being irradiated with such active light, the area turns hydrophobic by the photocatalysis of titanium dioxide.

Irradiation for initialization may be carried out either planar exposure (exposure of the entire surface of the plate to light with uniform intensity) or scanning exposure. Light sources fit for planar exposure include a mercury lamp, a tungsten-halide lamp, other metal halide lamps, and a xenon discharge lamp.

The quantity of light for initialization ranges from 0.1 to 1000 J/cm$^2$, preferably 0.2 to 100 J/cm$^2$, still preferably 0.2 to 10 J/cm$^2$.

The reciprocity law often applies to photocatalyzed reactions. For example, exposure at 10 mW/cm$^2$ for 100 seconds and exposure at 1 W/cm² for 1 second often result in the same effect. In such cases, the freedom of choice of the light source for initialization is broader.

Initialization by scanning exposure is carried out by using a beam which is not image-modulated and has an increased diameter (about 30 to 50 μm) compared with the beam for imagewise exposure. Known lasers oscillating an active light beam can be used as a beam source, such as a helium-cadmium laser having an oscillation wavelength of 325 nm, a water-cooled argon laser having an oscillation wavelength of 351.1 to 363.8 nm, and a zinc sulfide/cadmium laser having an oscillation wavelength of 330 to 440 nm. An InGaN quantum well semiconductor laser having an oscillation wavelength of 360 to 440 nm, which belongs to GaN lasers which have been confirmed to oscillate in the ultraviolet region and the near ultraviolet region, and an MgO—LiNbO₃ waveguide laser of inverted domain wavelength conversion type having an oscillation wavelength of 360 to 430 nm are also useful. Lasers having an output power of 0.1 to 300 W can be used. The same far-ultraviolet solid state laser as used for imagewise exposure may be used without image modulation. In using a pulsed laser, a preferred peak output power is no less than 1000 W, particularly 2000 W. Where the support is transparent, the exposure may be from the support side.

Because titanium dioxide is a high-temperature hydrophilic photocatalytic compound which becomes hydrophilic on heating to 250° C. or higher, initialization is also accomplished by heating in place of active light irradiation. Heating can be effected by blown air heating, infrared heating, microwave heating, electric bulb heating, and the like.

The initialization operation is conducted at any stage after the ink removal up to overall hydrophobilization for next platemaking. To avoid adverse influences of storage on a printing plate precursor, it is advised that the ink-free printing plate be initialized when it is reused as a precursor.

The inventors have not completely confirmed the possible maximum number of times of regenerating the printing plate into a precursor, it would be at least 15 times. It seems that the maximum times of regeneration will be limited by unremovable stains, scratches beyond repair in practice, and mechanical deformation of the plate.

III. Printing Apparatus

The printing apparatus for carrying out the printing method using the printing plate (precursor) according to the present invention will be described with reference to the accompanying drawings.

The printing apparatus embraces an embodiment in which a printing plate precursor having a titanium dioxide-containing surface layer is fitted on a plate cylinder and processed into a printing plate on the cylinder, an embodiment in which a printing plate precursor as fitted on a plate cylinder is processed into a printing plate and, after use, regenerated (cleaned and initialized) into a precursor, and an embodiment in which a printing plate precursor is processed into a printing plate, which is then fixed to a plate cylinder.

Embodiment 1:

In embodiment 1, which is typical of the present invention, a printing plate precursor as fitted on a plate cylinder is made into a printing plate, used for printing, and regenerated into a reusable precursor.

Figure 2:
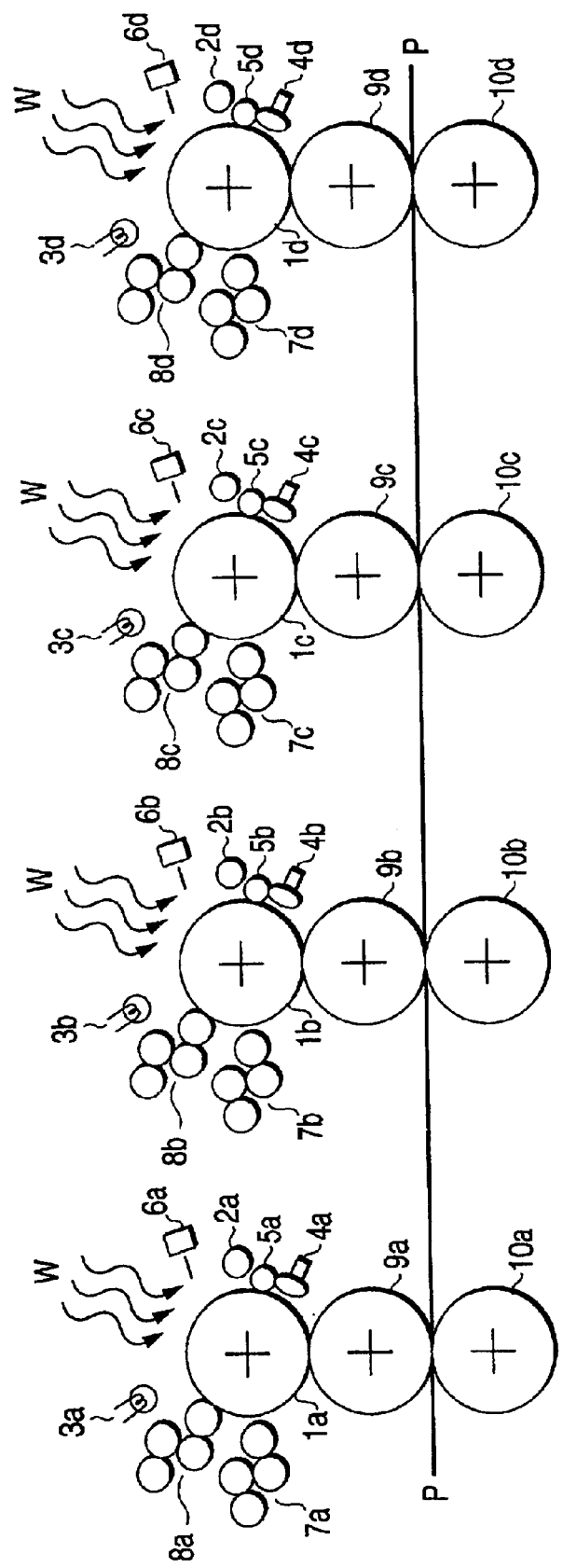
FIG. 2 shows a configuration of a lithographic printing apparatus according to an embodiment of the present invention.

FIG. 2 shows a configuration of a lithographic printing apparatus which can be used in this typical embodiment. The apparatus shown is for multicolor printing, having four platemaking-printing mechanisms a, b, c and d which are disposed linearly from left to right. The four mechanisms are structurally and functionally the same except for the kind of ink applied and the monochromatic image information to be printed. Paper P is printed in multicolor while passing through the line of the mechanisms. In what follows, the left-hand mechanism a will be described as a representative of the four. Every member or part making up the mechanisms a, b, c, and d is numbered together with symbols a, b, c, and d, respectively.

The mechanism a comprises a plate cylinder 1a around which a printing plate precursor having a photocatalytic titanium dioxide-containing surface layer is fixed (the precursor itself as attached to the cylinder is not shown nor numbered), a hydrophobilizing part 4a which applies a hydrophobilizer to the precursor on the plate cylinder 1a to hydrophobilize the entire surface of the precursor, a squeegee 5a which removes excess of the hydrophobilizer, an imagewise exposing part 6a which imagewise irradiates the precursor with far-ultraviolet active light to form an imagewise hydrophilicity/hydrophobicity distribution, an inking part 7a which feeds ink to the precursor having hydrophobic areas (non-irradiated areas) and hydrophilic areas (irradiated areas), i.e., a printing plate, a dampening part 8a which feeds a fountain solution to the printing plate, a cleaning part 2a which removes residual ink from the printing plate on the plate cylinder 1a after completion of printing, an initializing part 3a which removes the platemaking and printing history, such as the hydrophilicity/hydrophobicity distribution, from the ink-free printing plate, a blanket cylinder 9a which is an intermediate for transferring the ink from the printing plate onto the paper P, and an impression cylinder 10a which holds the paper P with the blanket cylinder 9a. These members and parts are assembled into the platemaking-printing mechanism a in the main body of the printing apparatus.

Figure 3:
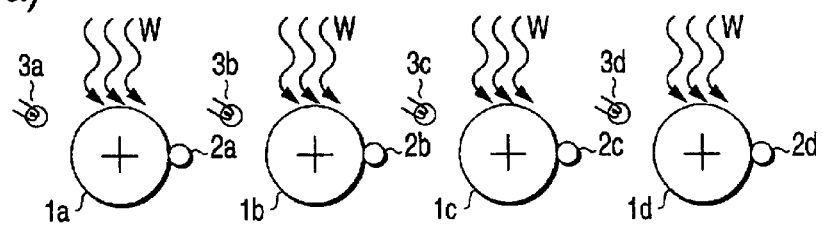
FIGS. 3(A) to 3(D) shows a flow of platemaking and printing according to the embodiment of FIG. 2.
Figure 3:
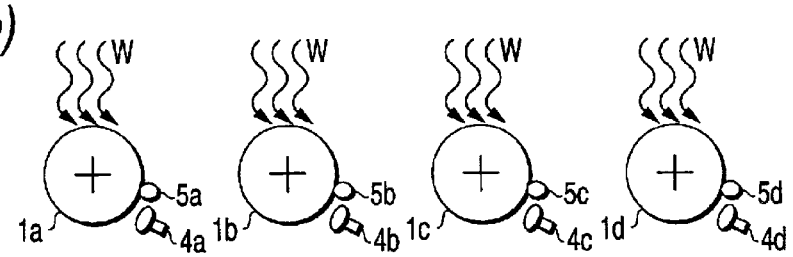
Figure 3:
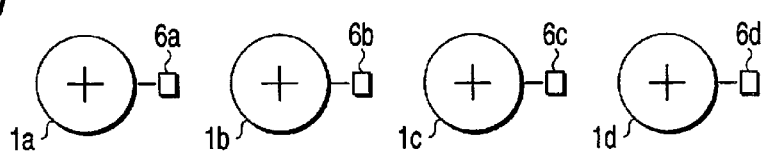
Figure 3:
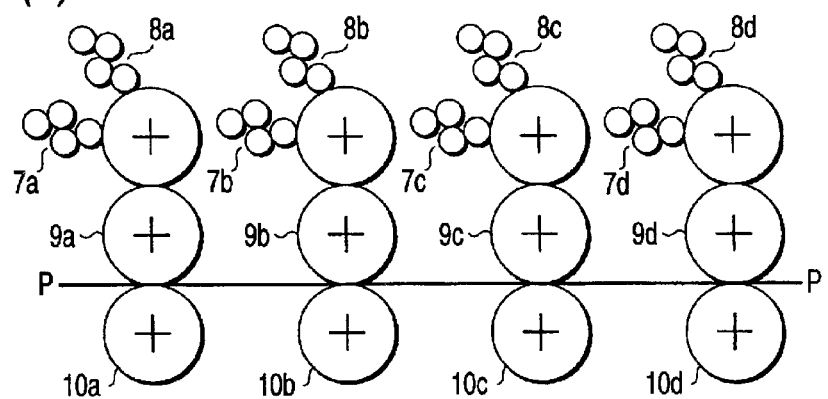

The action of the printing apparatus shown in FIG. 2 is described by referring to FIG. 3, which shows the flow of platemaking and printing method of the invention. The flow starts with step (a) wherein a printing plate is regenerated into a printing plate precursor after completion of the preceding platemaking-printing cycle. In step (a), ink solvent is fed from the cleaning part 2a to the printing surface of the printing plate on the plate cylinder 1a to remove the printing ink adhered. The cleaned surface is dried with drying air W and then irradiated with active light all over in the initializing part 3a to be regenerated. The series of operations of step (a) are carried out while revolving the plate cylinder 1a. The speed of revolution in this particular example is 0.5 rpm. The light source of the initializing part 3a need not emit light in the far-ultraviolet region. For example, a laser emitting near-ultraviolet light, a mercury lamp, or a xenon lamp will do.

In step (b), the surface of the initialized printing plate precursor is hydrophobilized. In this particular example, a hydrophobilizer is sprayed to form a hydrophobilizing layer while the plate cylinder 1a is revolved at a speed of 0.5 rpm. Otherwise, a hydrophobilizing layer is formed by spread coating with a hydrophobilizer or by condensing vapor of a hydrophobilizer. The totally hydrophobilized surface is wiped with the squeegee 5a to remove excess of the hydrophobilizer and dried with drying air W.

In step (c), the printing plate precursor is imagewise exposed to far-ultraviolet light in the imagewise exposing part 6a, whereby the irradiated areas are hydrophilized to produce an imagewise polarity distribution. In the embodiment shown, a solid state laser emitting far-ultraviolet light having an oscillation wavelength of 256 nm is used as a light source. Since titanium dioxide has sufficiently high sensitivity to light of this wavelength in polarity conversion, the revolution speed of the plate cylinder in step (c) is 200 rpm. Namely, image formation completes in a practically short time.

If desired, while not shown, an aqueous solution of a hydrophilic substance, especially an acid, can be applied to the resulting printing plate by means of the dampening part 8a or a separately provided applicator to enhance the hydrophilicity of the irradiated areas.

In step (d), which is a printing step, printing ink and fountain solution are fed from the inking part 7a and the dampening part 8a, respectively, to the printing surface. If desired, the printing surface may be treated with a burning conditioner prior to the ink and fountain solution feed to increase the polarity difference. The revolution speeds of the plate cylinders 1a, 1b, 1c, and 1d are decided appropriately so that all the mechanisms a, b, c, and d achieve printing on the running paper P at the same speed. The paper P is fed between the blanket cylinder 9a and the impression cylinder 10a, and the ink on the printing plate is transferred to the paper via the blanket cylinder 9a to carry out printing. After completion of printing, the printing plate on the plate cylinder 1a is subjected to a next regeneration-platemaking-printing cycle starting with step (a).

Figure 4:
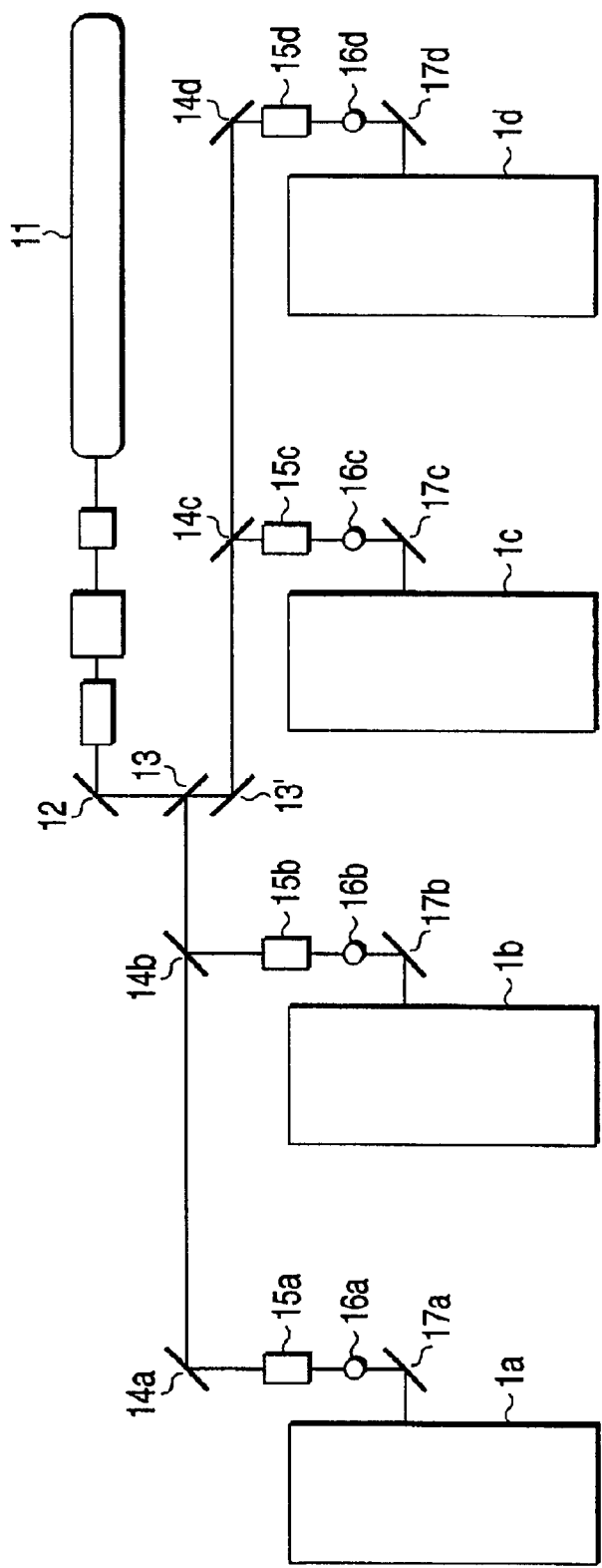
FIG. 4 schematically illustrates the constitution of an imagewise exposing part of the lithographic printing apparatus according to the invention.

In the above-described regeneration-platemaking-printing cycle the imagewise exposing part 6a, which is characteristic of the present invention, i.e., the unit for imagewise irradiating the hydrophobilized printing plate precursor with far-ultraviolet active light is described in more detail with reference to FIG. 4. FIG. 4 presents a schematic illustration showing the mechanism and the structure of the imagewise exposing part using a solid state laser as a light source. The solid state laser 11 has oscillation wavelengths of 512 nm and its half, i.e., 256 nm. In this embodiment, far-ultraviolet light having a wavelength of 256 nm is made use of. Laser light emitted from the laser 11 is made into parallel beams through a collimator and reflected and split through an optical system composed of mirrors 12, 13', 14a, 14d and half mirrors 13, 14c, and 14b to reach the platemaking-printing mechanisms a, b, c, and d. Each split beam passes through the respective optical device system for bearing image information which comprises a spatial light modulator 15a, 15b, 15c or 15d and a condensing lens 16a, 16b, 16c or 16d into a laser beam bearing the respective monochromatic image information, which, being reflected on a half mirror 17a, 17b, 17c or 17c, reaches to the printing plate precursor to conduct imagewise exposure.

Since the plate cylinder 1 is revolving, the image-modulated laser beam scans the printing plate precursor in the revolving direction whereby the beam-irradiated area is made hydrophilic while leaving the non-irradiated area hydrophobic to form an imagewise hydrophilicity/hydrophobicity distribution.

Figure 5:
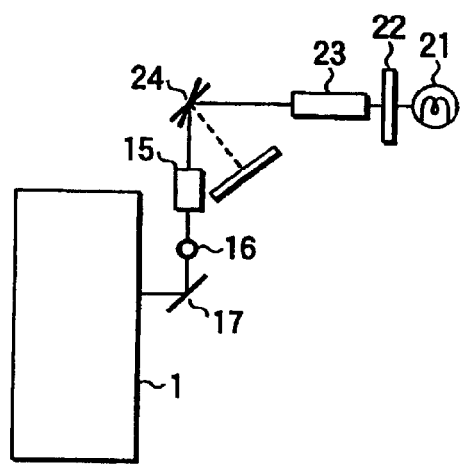
FIG. 5 schematically illustrates another imagewise exposing part of the lithographic printing apparatus according to the invention.

Embodiment 2:

In embodiment 2, a low-pressure mercury lamp is used as a far-ultraviolet light source of the imagewise exposing part 6a in place of the solid state laser as used in embodiment 1. FIG. 5 shows an imagewise exposing part using, a low-pressure mercury lamp as a far-ultraviolet light source. Light having a bright line spectrum in the far-ultraviolet region emitted from a low-pressure mercury lamp 21 is made into monochromatic light having a wavelength of 253.7 nm through a cut filter 22 that cuts longer wavelengths. The monochromatic light is passed through an optical system 23 for uniform light preparation to have a leveled light quantity distribution. While FIG. 5 shows the imagewise exposing part of only the platemaking-printing mechanism a for the sake of convenience, the thus processed far-ultraviolet light is split through an optical system not shown, and each split beam is sent to a spatial modulator 24 of each of the platemaking-printing mechanisms a, b, c, and d. As mentioned with respect to FIG. 2, the other three mechanisms b, c, and d have the same configuration as the mechanism a, except for the kind of ink applied and the monochromatic image information to be printed. The beam from the spatial modulator 24, which bears monochromatic image information, passes through an image forming optical system comprising a focusing optical system 15, a focus adjusting lens 16, and a mirror 17 leading the beam to the printing plate precursor, and imagewise scans the printing plate precursor.

Instead of using a spatial modulator, the whole width of the printing plate precursor may be exposed to light from a slit disposed at right angles or obliquely with respect to the revolving direction of the plate cylinder through an image mask which is provided on the precursor. The slit width does not always need to be narrow. The illuminance, the slit width, and the revolution speed of the plate cylinder are decided so as to create an imagewise hydrophilicity/hydrophobicity distribution on the precursor surface. A lamp house having an irradiation width adjusted to the width of the precursor may be used in place of the slit. As previously stated, the image mask must have an imagewise transparency/opacity distribution for far-ultraviolet light. That is, the substrate of the mask should be transparent to far-ultraviolet rays or at least distinguishable from the opaque image area of the mask, and an image area is formed thereon of an opaque material.

Thus, a printing plate having high hydrophilicity/hydrophobicity contrast can be prepared from a precursor fixed around a plate cylinder simply by uniform hydrophobilization with a hydrophobilizer and imagewise exposure to far-ultraviolet light. Platemaking involves no developing processing, and the resulting printing plate maintains high image sharpness. The printing plate can be regenerated into a printing plate precursor by cleaning and initialization (overall exposure to heat mode light, contact heating or conduction heating) for reuse. As a result, printed matter can be produced at a reduced cost. Further, there is no need to remove the printing plate from the plate cylinder, which excludes the possibility of a printing surface being contaminated with dust when mounted on a printing apparatus as has been experienced with conventional presensitized plates. As a result, print quality is improved.

Where the printing plate is prepared from a precursor while fixed on the plate cylinder 1, and the hydrophobilizing part 4, the inking part 7, the dampening part 8, the cleaning part 2, the initializing part 3, and the imagewise exposing part 6 are arranged around the plate cylinder 1, a series of operations for platemaking, printing, and regeneration (overall hydrophobilization, imagewise exposure to far-ultraviolet active light, feed of printing ink and fountain solution, and cleaning and initialization after completion of printing) can be accomplished simply by revolving the plate cylinder 1. Therefore, the apparatus can be made compact, affording a considerable space saving.

Compared with other simplified platemaking systems utilizing photocatalysis of titanium dioxide heretofore proposed, the system according to the invention using imagewise irradiation with far-ultraviolet active light achieves higher sensitivity in polarity conversion between hydrophobicity and hydrophilicity, making it possible to produce a printing plate with a higher contrast between image areas and non-image areas in a practically short exposure time with good fidelity. Hence, the invention brings about improved printing performance and an improved press life. Besides, the light sources used in the invention incur no increase of cost.

The present invention swill now be illustrated in greater detail with reference to Examples, but it should be understood that the invention is not construed as being limited thereto. Unless otherwise noted, all the percents are by weight. In Examples, a water contact angle was measured by an water drop in air method with Contact Angle Meter CA-D manufactured by Kyowa Kaimen Kagaku K.K.

EXAMPLE 1

In Example 1 is presented a specific example of the above-described embodiment 1.

A 0.30 mm thick rolled plate of an aluminum alloy comprising 99.5% aluminum, 0.01% copper, 0.03% titanium, 0.3% iron, and 0.1% silicon (JIS A1050) was grained with a 20% aqueous suspension of pumice stone (400 mesh, available from Kyoritsu Ceramic Materials Co., Ltd.) and a rotating nylon brush made of nylon-6,10, followed by thoroughly washing with water. The grained aluminum plate was etched in a 15% sodium hydroxide aqueous solution containing 4.5% aluminum to dissolve out 5 g/m$^2$ of aluminum, followed by washing with running water. After neutralization with 1% nitric acid, the plate was electrolytically grained in a 0.7% aqueous nitric acid solution containing 0.5% aluminum by applying a square wave alternating voltage (current ratio r: 0.90; the current wave form is disclosed in JP-B-58-5796) under conditions of 10.5 V in anode potential, 9.3 V in cathode potential, and 160 C/dm$^2$ in quantity of anode electricity. After washing with water, the plate was immersed in a 10% sodium hydroxide aqueous solution at 35° C. to dissolve out 1 g/m$^2$, followed by washing with water. The etched plate was then desmutted in a 30% sulfuric acid aqueous solution at 50° C. and washed with water.

The plate was anodized in a 20% aqueous sulfuric acid solution at 35° C. containing 0.8% aluminum by applying a direct current at a current density of 13 A/dm$^2$ for an adjusted electrolysis time to form 2.7 g/m$^2$ of a porous anodized layer. The plate was soaked in a 3% aqueous sodium silicate solution at 70° C. for 30 seconds, washed with water, and dried. The resulting aluminum support had a reflective density of 0.30 as measured with a reflection densitometer Macbeth RD920 and an average center-line roughness of 0.58 μm.

The aluminum support was put in a sputtering system, and metallic titanium was sputtered by electrically heating in an atmosphere of 2.0×10$^{-2}$ Pa having an oxygen partial pressure of 70% to deposit a titanium dioxide thin film on the aluminum support. X-Ray structure analysis on the crystal components of the deposited film revealed that the amorphous/anatase/rutile crystal ratio was 1.5/6.5/2. The TiO$_2$ thin film had a thickness of 90 nm.

The resulting printing plate precursor was fixed around a plate cylinder of a printing apparatus shown in FIGS. 2 through 4. The solid state laser used for imagewise exposure (see FIG. 4) was also used in the initializing part 3. That is, in the initializing step, the entire surface of the printing plate on the plate cylinder 1 was hydrophilized while revolving the cylinder 1 at 0.5 rpm by scanning with an active light beam bearing no image signals (not modulated in the modulator 15 of FIG. 4) and having the diameter adjusted to 50 μm so as to be capable of uniform irradiation at an energy intensity of 200 mJ/cm$^2$. The initialized plate surface had a water contact angle between 8 and 11° in every site of measurement.

In the hydrophobilizing part 4a of FIG. 2, a 10% n-octadecyltrichlorosilane solution was sprayed by means of an atomizer to the printing plate precursor while revolving the plate cylinder at a speed adjusted so that the precursor passed under the hydrophobilizing part 4a in 3 seconds (=0.5 rpm) and dried to form a hydrophobilizing layer on the entire surface of the precursor. The water contact angle of the precursor thus hydrophobilized was between 78 and 83° in every site of measurement.

In the imagewise exposing part 6a of FIG. 2, the precursor was scanned with image-modulated far-ultraviolet light having a wavelength of 256 nm emitted from the solid state laser shown in FIG. 4 while revolving at 200 rpm to form an imagewise hydrophilicity/hydrophobicity distribution. The light energy intensity in the area uniformly irradiated with the active light was (65 mJ/cm$^2$. The water contact angle of the irradiated area was between 8 and 12°.

Lithographic printing was carried out to produce 1000 prints by feeding printing ink (Newchampion F Gloss 85 Sumi, available from Dainippon Ink & Chemicals, Inc.) in the inking part 7a and pure water as a fountain solution in the dampening part 8a. As a result, clear prints were obtained from start to finish. No scratches was observed on the printing plate.

In the cleaning part 2a, the printing plate on the plate cylinder 1a was carefully and thoroughly cleaned to remove residual ink with a soft cloth impregnated with a 1/1 mixture of a printing ink cleaner Dai-clean R (available from Dainippon Inks & Chemicals, Inc.) and toluene. The ink-free printing plate was then irradiated with far-ultraviolet rays in the initializing part 3a in the same manner as described above. The resulting printing plate precursor had a water contact angle ranging from 8 to 12° C. in every site of measurement, indicating that the plate surface had restored its original state as a precursor.

The printing plate precursor having experienced one platemaking-printing-regeneration cycle on the plate cylinder was subjected to the next platemaking and printing procedures in the same manner as described above while being fixed on the cylinder to obtain 1000 prints. As a result, clear prints were obtained from start to finish. No scratches was observed on the printing plate.

When the above-described platemaking-printing-regeneration cycles were repeated 5 times, there was observed no change in contact angle after active light irradiation and image sharpness of the printing surface. It was thus proved that a printing plate precursor comprising an aluminum support with a titanium dioxide surface layer can be made into a printing plate through simple procedures comprising initialization, overall hydrophobilization, and imagewise exposure to far-ultraviolet active light having as low energy as 65 mJ/cm$^2$ and that the printing plate can be regenerated for repeated use simply by cleaning to remove residual ink and irradiation with active light to remove history.

EXAMPLE 2

A printing plate precursor was prepared and processed into a printing plate, and the printing plate was tested in the same manner as in Example 1, except for replacing the solid state laser used in the initializing part 3a and the imagewise exposing part 6a with a low-pressure mercury lamp having a bright line spectrum at 253.7 nm (mercury vapor pressure: about 0.1 Pa; the bright line spectrum at 453.8 nm was cut by a filter). Similarly to Example 1, the ultraviolet light from the light source was not image-modulated in the initialization and modulated according to monochromatic image information in the imagewise exposure. The light energy intensity was 200 mJ/cm$^2$ in the initialization and 65 mJ/cm$^2$ in the imagewise exposure.

The printing plate precursor after initialization had a water contact angle in a range of from 7 to 9° in every site of measurement. The contact angle after overall hydrophobilization was between 76 and 79° in the first and the second cycle. The contact angle of the imagewise exposed area was between 9 and 13°. The prints obtained in both the first and the second cycles were free from background stains and exhibited clear distinguishability between image areas and non-image areas.

COMPARATIVE EXAMPLE 1

A printing plate precursor was prepared and processed into a printing plate, and the printing plate was tested in the same manner as in Example 1, except for replacing the solid state laser used in the imagewise exposing part 6a with a light source unit UNILEC URM-600 Model GH-60201X, supplied by Ushio U-tech Inc., having a laser light source emitting near-ultraviolet light (Light intensity for imagewise exposure: 65 mJ/cm$^2$).

The printing plate precursor after initialization had a water contact angle in a range of from 7 to 9° in every site of measurement. The contact angle after overall hydrophobilization was between 76 and 79°. However, the contact angle of the imagewise exposed area was between 69 and 73°. As a result of printing, the distinguishability between image areas and non-image areas was insufficient, and the printing plate has poor printing quality, suffering from appreciable background stains. It is seen that the printing plate precursor had low sensitivity to light in the near-ultraviolet region in changing the surface polarity so that the amount of exposure used (65 mJ/cm$^2$) was insufficient for forming a distinguishable imagewise hydrophilic/hydrophobic distribution.

COMPARATIVE EXAMPLE 2

The same procedures as in Comparative Example 1 were repeated, except that the imagewise exposure using Unilec URM600 Model GH60201X was carried out at a doubled light intensity (130 mJ/cm$^2$) by reducing the plate cylinder revolution speed by half.

The printing plate precursor after initialization had a water contact angle in a range of from 7 to 9° in every site of measurement. The contact angle after overall hydrophobilization was between 76 and 79°. The contact angle of the imagewise exposed area was between 45 and 53°. As a result of printing, some improvement over Comparative Example 1 was observed, but the distinguishability between image areas and non-image areas was still insufficient. When 300 prints were produced, the printing plate was found suffering from background stains, giving unsatisfactory print quality.

COMPARATIVE EXAMPLE 3

The same procedures as in Example 2 were repeated, except that the low-pressure mercury lamp emitting far-ultraviolet light used in the initializing part 3a and the imagewise exposing part 6a was replaced with a high-pressure mercury lamp having a vapor pressure of 9.8 Pa, which is known to have a bright line spectrum showing intense peaks at 365.0 nm and between 577.0 and 579.1 nm. Similarly to Example 2, the ultraviolet light from this exposure unit was not image-modulated in the initializing part and modulated according to monochromatic image information in the imagewise exposing part. The light energy intensity was 200 mJ/cm$^2$ in the initialization and 65 mJ/cm$^2$ in the imagewise exposure.

The printing plate precursor after initialization had a water contact angle in a range of from 7 to 9° in every site of measurement. The water contact angle after overall hydrophobilization was between 76 and 79°. The contact angle of the imagewise exposed area was between 44 and 50°. As a result of printing, the distinguishability between image areas and non-image areas was insufficient. When 350 prints were produced, the printing plate was found suffering from background stains, affording unsatisfactory print quality.

COMPARATIVE EXAMPLE 4

The same procedures as in Example 1 were repeated, except that the revolving speed of the plate cylinder during overall hydrophobilization on the initialized precursor was reduced to 0.2 rpm thereby to 2.5-fold increase the spray coating thickness.

The printing plate precursor after initialization had a water contact angle in a range of from 8 to 11° in every site of measurement. The water contact angle after overall hydrophobilization was between 130 and 134°. The water contact angle of the exposed area after imagewise exposure was between 75 and 78°. As a result of printing, the distinguishability between image areas and non-image areas was insufficient. When 400 prints were produced, the printing plate was found suffering from background stains, affording poor print quality. It is understood from the results that too thick a hydrophobilizing layer results in poor sensitivity even to far-ultraviolet light for turning hydrophilic, failing to imagewise form a distinct hydrophilicity/hydrophobicity distribution.

COMPARATIVE EXAMPLE 5

The same procedures as in Example 1 were repeated, except that the revolving speed of the plate cylinder during overall hydrophobilization on the initialized precursor was increased to 1.5 rpm thereby to reduce the spray coating thickness to one-third.

The printing plate precursor after initialization had a water contact angle in a range of from 8 to 11° in every site of measurement. The water contact angle after overall hydrophobilization was between 45 and 49°. The water contact angle of the exposed area after imagewise exposure was between 8 and 11°. In the printing test, the printing plate had insufficient ink receptivity on its image areas showing poor contrast between image areas and non-image areas, presenting poor print quality. It has now understood that too thin a hydrophobilizing layer causes polarity change into hydrophilicity to occur even in the non-image areas when imagewise exposed to far-ultraviolet light, resulting in a failure to provide a sufficient imagewise hydrophilicity/hydrophobicity distribution.

EXAMPLE 3

Figure 6:
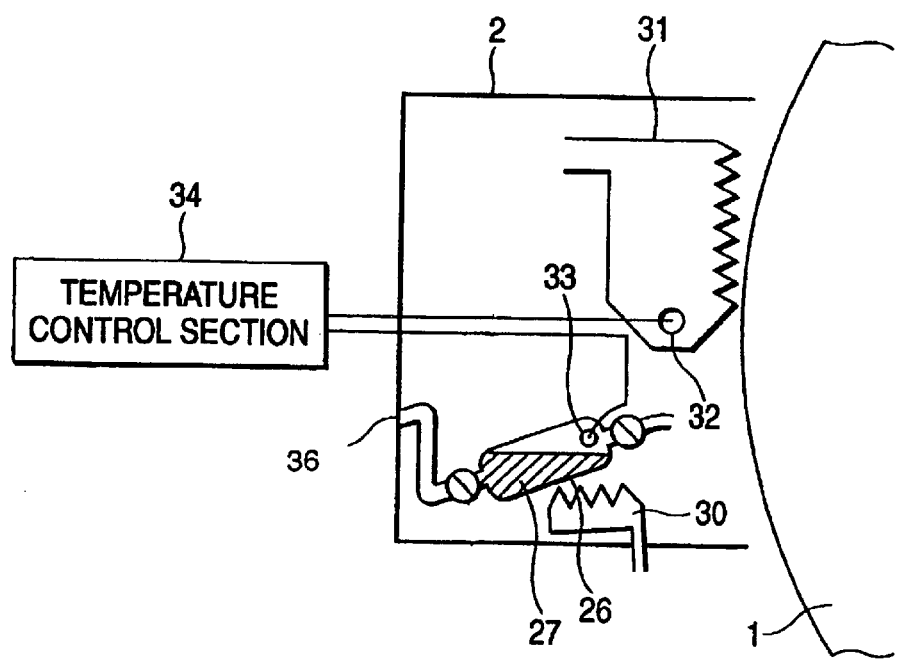
FIG. 6 shows a hydrophobilizing part of the lithographic printing apparatus according to the invention.

The following test was carried out using, in the overall hydrophobilizing part 4a (FIG. 2), a hydrophobilizing unit of the type shown in FIG. 6 in which vapor of a hydrophobilizer is condensed to form a hydrophobilizing layer. The hydrophobilizing unit had a glass tube 26 having an inner diameter of about 30 mm (a separatory funnel was made use of) was connected to an air inlet 36 almost horizontally to that open air might enter the inside of the unit through the glass tube 26. Diatomaceous earth impregnated with silicon oil (Silicon KF99 available from Shin-Etsu Chemical Co. Ltd.) 27 was put into the lower half of the glass tube 26 (50% of the volume of the glass tube). The glass tube 26 was heated by an electric heater 30 so that the temperature of air entering through the inlet 36 was elevated from room temperature up to 150° C. while passing through the tube. Since Silicon KF99 has a vapor pressure of at least 1 mmHg at that temperature, the air entering the inside of the unit contained vapor of Silicon KF99. The air exchange rate in the inside space of the unit, which was 2 liters, was 10 vol % per minute. In FIG. 6, numeral 31 indicates an electric heater, numerals 32 and 33 are temperature sensors, and numeral 34 is a temperature control section.

The same platemaking-printing-regeneration procedures as in Example 1 were repeated except for using the above-described hydrophobilizing unit. The water contact angle of the hydrophobilizing layer provided on the printing plate precursor was between 80 to 82°. As a result of printing to obtain 1000 prints, clear prints were produced from start to finish similarly to Example 1. The changes in water contact angle caused by irradiation-induced polarity changes, the print quality, and durability against repeated use of the printing plate were equal to the results in Example 1.

Since the printing plate precursor of the invention, which has a photocatalytic titanium dioxide-containing surface layer, has high sensitivity to far-ultraviolet light, the precursor having formed thereon a hydrophobilized layer changes its polarity upon being exposed to far-ultraviolet light within a practically short time to directly provide a printing plate having a distinct image area/non-image area distribution without requiring a developing processing. An additional merit of the invention is that the printing plate can be regenerated for reuse after completion of printing by removing residual ink and removing the platemaking history by light or heat. The invention also provides a printing apparatus having an imagewise exposing unit using far-ultraviolet light, in which the printing plate precursor can be processed into a printing plate, used for printing, and regenerated for repeated use while being fixed onto a plate cylinder. The method and the system of the invention afford great advantages over conventional ones using visible or near-ultraviolet light for imagewise exposure in terms of contrast between image areas and non-image areas which leads to improved print quality.

What is claimed is:

1. A method of forming a lithographic plate, comprising
   forming a uniform layer of a hydrophobic substance on the entire surface of a printing plate precursor, said printing plate precursor having a titanium dioxide-containing surface layer, and
   irradiating the surface of the precursor with active light to form imagewise hydrophilic areas to make a printing plate,
   wherein said active light is far-ultraviolet light having a wavelength of 250 to 320 nm.

2. The method according to claim 1, wherein said far-ultraviolet light is emitted from a solid state laser having an oscillation wavelength of 256 nm or a low-pressure mercury lamp having a vapor pressure of 0.1 kPa or lower.

3. The method according to claim 1 or 2, wherein said layer of the hydrophobic substance is formed to such a thickness as to have a contact angle with a water drop of 70 to 120°.

4. The method according to claim 1 or 2, wherein said printing plate precursor comprises a grained aluminum support having provided thereon said titanium oxide-containing surface layer.

5. The method according to claim 1 or 2, wherein said hydrophobic substance is a subliming solid or a volatile liquid, and said layer of the hydrophobic substance is formed by condensing vapor of said hydrophobic substance on said titanium oxide-containing surface layer.

6. The method according to claim 1 or 2, wherein said hydrophobic substance is an organic polymer, and said layer of the hydrophobic substance is formed by spraying a solution or dispersion of said organic polymer onto said titanium oxide-containing surface layer.

7. The method according to claim 1 or 2, wherein said layer of the hydrophobic substance is formed on said titanium oxide-containing layer by spread coating, spray coating, vapor condensation, gas contact or dip coating.

8. The method according to claim 3, wherein said printing plate precursor comprises a grained aluminum support having provided thereon said titanium oxide-containing surface layer.

9. The method according to claim 3, wherein said hydrophobic substance is a subliming solid or a volatile liquid, and said layer of the hydrophobic substance is formed by condensing vapor of said hydrophobic substance on said titanium oxide-containing surface layer.

10. The method according to claim 3, wherein said hydrophobic substance is an organic polymer, and said layer of the hydrophobic substance is formed by spraying a solution or dispersion of said organic polymer onto said titanium oxide-containing surface layer.

11. The method according to claim 3, wherein said layer of the hydrophobic substance is formed on said titanium oxide-containing layer by spread coating, spray coating, vapor condensation, gas contact or dip coating.

12. A lithographic printing method, comprising:
    forming a uniform layer of a hydrophobic substance on the entire surface of a printing plate precursor, said printing plate precursor having a titanium dioxide-containing surface layer;
    irradiating the surface of the precursor with active light to form imagewise hydrophilic areas to make a printing plate, wherein said active light is far-ultraviolet light having a wavelength of 250 to 320 nm;
    applying ink solvent to the printing plate; and
    transferring ink from the printing plate onto a medium to be printed.

13. The method according to claim 12, wherein said far-ultraviolet light is emitted from a solid state laser having an oscillation wavelength of 256 nm or a low-pressure mercury lamp having a vapor pressure of 0.1 kPa or lower.

14. The method according to claim 12 or 13, which further comprises removing residual ink from the printing plate after completion of printing to regenerate said printing plate as a printing plate precursor.

15. The method according to claim 12 or 13, wherein said layer of the hydrophobic substance is formed to such a thickness as to have a contact angle with a water drop of 70 to 120°.

16. The method according to claim 15, further comprising removing residual ink from the printing plate after completion of printing to regenerate said printing plate as a printing plate precursor.

* * * * *